(12) United States Patent
Wuersch et al.

(10) Patent No.: US 7,413,106 B2
(45) Date of Patent: Aug. 19, 2008

(54) METHOD FOR FIXING A MINIATURIZED COMPONENT TO A CARRIER PLATE

(75) Inventors: Alain Wuersch, La Tour-de-Peilz (CH);
Stephane Rossopoulos, Ursins (CH);
Irène Verettas, Lausanne (CH);
Reymond Clavel, Oulens/Echallens (CH)

(73) Assignee: Leica Geosystems AG, Heerbrugg (CH)

( * ) Notice: Subject to any disclaimer, the term of this patent is extended or adjusted under 35 U.S.C. 154(b) by 383 days.

(21) Appl. No.: 10/536,402

(22) PCT Filed: Nov. 28, 2003

(86) PCT No.: PCT/EP03/13400

§ 371 (c)(1),
(2), (4) Date: Jun. 14, 2005

(87) PCT Pub. No.: WO2004/052070

PCT Pub. Date: Jun. 17, 2004

(65) Prior Publication Data

US 2006/0163320 A1  Jul. 27, 2006

(30) Foreign Application Priority Data

Nov. 29, 2002  (EP) ................................. 02026650

(51) Int. Cl.
*B23K 1/00* (2006.01)

(52) U.S. Cl. .................... 228/8; 228/101; 228/103; 228/212

(58) Field of Classification Search ............... 702/33, 702/43; 228/101, 104, 8, 103, 212; 700/245, 700/260, 257, 253; 623/64; 901/42; 156/64, 156/358, 360; 269/54
See application file for complete search history.

(56) References Cited

U.S. PATENT DOCUMENTS

| | | | |
|---|---|---|---|
| 5,081,336 A | 1/1992 | Schuster et al. | |
| 6,554,244 B1 * | 4/2003 | Remy De Graffenried et al. | 248/694 |
| 6,616,031 B2 * | 9/2003 | Wong et al. | 228/102 |
| 7,303,111 B2 * | 12/2007 | Gaunekar et al. | 228/4.1 |
| 2001/0046723 A1 | 11/2001 | Hudson et al. | |
| 2002/0121789 A1 * | 9/2002 | Duebel et al. | 294/64.1 |

FOREIGN PATENT DOCUMENTS

| | | |
|---|---|---|
| DE | 35 31 715 A1 | 3/1987 |
| WO | WO 99/26754 | 6/1999 |
| WO | WO 00/28376 | 5/2000 |

OTHER PUBLICATIONS

Alain Wuersch et al. "An Innovative Micro Optical Element Assembly Robot Characterized by High Accuracy and Flexibility", IEEE, Electronic Components and Technology Conference, 2000 pp. 218-222.*

* cited by examiner

*Primary Examiner*—Jerry Lorengo
*Assistant Examiner*—Erin P Barry
(74) *Attorney, Agent, or Firm*—Oliff & Berridge, PLC

(57) ABSTRACT

The invention relates to a method, a device and a system for fixing a miniaturized component—especially carrying or containing at least one optical element—to a carrier plate in a highly-precise manner, by means of a soldered joint, a welded joint or an adhesive joint. Said component is positioned above the carrier plate in a relation to outer reference points by means of a gripper pertaining to a robot station. A joint is then created between the component and the carrier plate, the joint seam hardening under contraction between the component and the carrier plate, thus exerting a vertical tractive force on the gripper holding the component. At the same time as the contraction, the gripper is vertically displaced towards the carrier plate in a controlled or regulated manner, optionally up to a defined nominal position, and actively yields to the contraction such that the creation of high tensions is largely avoided and the position does not change when the component is detached from the gripper. The invention also relates to a gripper for using in said method.

14 Claims, 2 Drawing Sheets

METHOD FOR FIXING A MINIATURIZED COMPONENT TO A CARRIER PLATE

The invention relates to a method and a device for highly precise fixing of a miniaturized component—in particular carrying or containing at least one optical element—to a carrier plate by means of a solder joint, weld joint or adhesive bond.

By using microassembly technology, in which automated robot assembly stations are used, components can be positioned on a carrier plate with high accuracy, namely almost the positioning resolution of the manipulator in the form of, for example, a gripper, which accuracy is less than 1 micron. In spite of the high positioning accuracy of the components on the carrier plate before the joining process, correspondingly exact final fixing accuracies can be achieved only to a limited extent since the positioning accuracy is often reduced during the joining of the component to the carrier plate by soldering, adhesive bonding or welding. One reason for this is the occurrence of shrinkage of the joint seam between the component and the carrier plate during cooling of the solder on soldering or of the weld seam on welding or during curing of the adhesive on adhesive bonding, which shrinkage is in particular vertical—perpendicular to the carrier plate.

The heat introduced in a localized manner in thermal joining methods causes expansion, the surrounding cold material inevitably producing compressions in the joint zone. During the subsequent cooling of the joint seam to room temperature, previously compressed regions shrink with further hindrance by the cold surrounding material. Shrinkage stresses or residual stresses and distortion or shrinkages unavoidably occur. Distortion and residual stresses depend in particular on the introduction of heat, the removal of heat and the prevention of shrinkage or the degree of gripping. It is known to a person skilled in the art that an advantageous possibility for shrinkage results in low stresses and residual stresses, whereas little possibility for shrinkage leads to great stresses, i.e. great residual stresses. Particularly with the use of a thermal joining method, i.e. soldering or welding, in which the manipulator is likewise subject to heating, in addition to the shrinkage of the joint seam there is also an additional shrinkage of the manipulator during the subsequent cooling. If the component is firmly held by the manipulator or gripper, both the shrinkage of the joint seam and the shrinkage caused by the cooling of the entire component, of the gripper and of further components cause stresses or tensile forces between the component and the carrier plate, which are partly relaxed as soon as the component is released from the manipulator or gripper. This results in undesired displacement of the component, with the result that the final accuracy of fixing of the component is correspondingly reduced. The stresses which have not been relaxed result in residual stresses, which may reduce the strength of the joint. The problem described is important particularly in the case of thermal joining methods, especially soldering, welding and hotmelt or adhesive plastisol bonding, but there is also a similar problem in the case of cold adhesive bonding if the curing of the adhesive is associated with shrinkage and/or heating.

WO 00/28376, the disclosure of which is hereby incorporated by reference, describes a device, including a method—in particular a soldering method—for thermally stable retention of a miniaturized component. The soldering method is carried out by a robot station using a gripper. The gripper grips the component, positions it a slight distance above a carrier plate in relation to outer reference points, holds it in its position during exposure to the laser and releases it after fixing has been completed. According to WO 00/28376, when designing a gripper it is necessary to make the fundamental choice of either designing the gripper virtually infinitely rigid so that it resists the metal shrinkage or to use a gripper having defined elasticity in the vertical direction—perpendicular to the carrier plate. In the latter case, the shrinkage is not hindered but is permitted in a defined direction in space, in particular perpendicular to the carrier plate. According to WO 00/28376, the second solution with the elastic gripper is preferable to the first one with the rigid gripper since a design which is nondeformable under the force generated by the shrinkage of the tin material would be too robust to be suitable for a robot station of high accuracy. The metal shrinkage produces a mechanical load which may be greater than the limiting tensile strength of the solder material and might therefore lead to failure of the joint. In a fictitious example, a defined component measuring 2×2×3 mm is used to demonstrate that, in the case of a 1 mm thick tin layer, a thermal shrinkage of 4 µm causes a stress of 288 N/mm$^2$. Since the load exerted on the tin in this case is much higher than its breaking point, there is inevitably a joint defect which may lead to failure of the entire fastening. Moreover, it is pointed out in WO 00/28376 that the final accuracy of fixing is not adversely affected by the use of an elastic construction for the pliable gripper if it is assumed that the gripper construction is sufficiently rigid to hold the retaining part in a fixed position during the duration of irradiation. The mechanical stresses virtually occur only if the tin layer changes its phase and returns to the solid state. From this time onwards, the deformability of the gripper plays a role. WO 00/28367 thus describes a gripper whose vertical position during the cooling or curing of the joint seam yields elastically and passively against the action of a spring. In this passive method, the vertical position reached after solidification is therefore dependent on the internal stress of the joint seam or on the tensile force on the gripper during the cooling or curing process, which in turn is dependent on the thickness of the solder or weld or adhesive layer. However, the thickness of this layer varies because of tolerances, and it is for this reason that the final position of the component is very dependent on chance. It is true that it is possible in theory, with an exact knowledge of all process parameters, to carry out the prepositioning of the component while taking into account the shrinkage. However, inter alia because of manufacturing tolerances and temperature inconsistencies, the shrinkage can be determined in advance only to a limited extent, so that deviations of the final position are unavoidable.

Maximum accuracy is therefore achievable here only under ideal and exactly known process conditions. Moreover, ensuring on the one hand the elastic mobility of the vertical position and on the other hand exact prepositioning of the component at a certain vertical position without the shrinkage being hindered by an excessively high spring constant is problematic.

DE 35 31 715 A describes a method for soldering surface-mountable components on circuit carrier plates provided with conductor patterns, with reliquefication of a solder deposit provided in the region of the soldering area. In the method, a component to be soldered is placed on the circuit carrier plate and positioned and then heat energy for liquefying the solder is supplied by means of a heated soldering tool movable in the region of the soldering areas. Therefor the soldering tool is placed on the conductor tracks of the circuit carrier plate, close to the soldering areas, in such a way that the heat energy required for liquefying the solder reaches the soldering area via the conductor tracks of the circuit carrier plate. The positioning of the component is carried out in a manner such that the component cannot execute any displacements in a direction parallel to the plane of the circuit carrier plate. However, the component remains movable in a direction normal to the circuit carrier plate in order to be able to be lowered in the direction towards the circuit carrier plate under the pressure of the separate pressure tool as soon as the solder of the solder deposit at the connection contacts liquefies. A punch pretensioned with a force of the order of magnitude of a certain fraction of 1 N may be mentioned as a special pressure tool. The method described in DE 35 31 715 A serves for pressing a component, while maintaining the positioning parallel to the carrier plate, at least during the placing of the soldering tool on the conductor track, with a predetermined contact pressure against the carrier plate. This method is suitable for mounting surface-mountable electrical circuit components which have to be fairly precisely positioned in a direction parallel to the carrier plate, in such a way that a defined contact with conductor tracks on the carrier plate is produced, and no electrical contact breaks or short-circuits occur. Since the final position of the electrical circuit components on a carrier plate, perpendicular to the carrier plate, plays only a minor role after the fixing process in the method disclosed but only a certain contact pressure of the component on the carrier plate need be ensured during liquefication of the solder material, DE 35 31 715 A gives no indication of a solution for producing a highly precise defined—in particular perpendicular—accuracy of the final positioning of the component relative to the carrier plate after solidification of the solder joint. In DE 35 31 715 A, no measures are taken for ensuring an accurate final position of the component and a joint with little stress. Since, in the method described, the heat is introduced on one side, there are inevitably asymmetries in the shrinkage which are unacceptable in the area of microoptics. The method described in DE 35 31 715 A is unsuitable as a method of microassembly technology for highly precise fixing of micro components which contain in particular microoptics.

There therefore continues to be a need in the area of microtechnology for an improvement of the positioning accuracy of miniaturized components, since the stress produced by shrinkage in the system, which consists in particular of the component, the joint seam, the carrier plate and the entire holder, is not completely compensated solely by the passive vertical position adjustment described above, and high accuracy of the final position in combination with a defect-free joint is not ensured.

It is the object of the invention to improve the accuracy of the final position of miniaturized components on a carrier plate after fixing of the joint, to avoid stresses in the system, in particular residual stresses at the joint, and to avoid joint defects, in particular cracks, bonding defects and other irregularities of fixing.

This object is achieved by realizing the features of the independent claims. Features which further develop the invention in an alternative or advantageous manner are described in the dependent claims.

According to the invention, for fixing a miniaturized component to a carrier plate, the component is gripped by a gripper of a robot station, held firmly and positioned above or on the carrier plate relative to outer reference points. A joint is then produced between the component and the carrier plate by soldering, adhesive bonding or welding. The solidification of the solder material or adhesive material or of the weld seam is associated with shrinkage—or possibly an expansion, for example in the case of a plastic adhesive material—of the joint seam between the component and the carrier plate, the gripper executing a controlled or regulated vertical movement in the direction towards the carrier plate—or away from the carrier plate—optionally up to a defined position, simultaneously with the shrinkage—or the expansion, and thus substantially actively, optionally continuously, yields to the shrinkage—or to the expansion. Tensile forces applied to the gripper are compensated and optionally completely equalized. The buildup of high internal stresses is thereby substantially prevented, so that any remaining residual stress on release of the components by the gripper no longer induces a change of position. Since, as a rule, the fixing processes are associated with a shrinkage and not with an expansion of the joint seam, the term "shrinkage" is always used below. Of course, it is possible to apply the teaching of the invention also to an expanding solidification process. This might theoretically be the case with the use of a synthetic joint material. Moreover, a tensile force is not inevitably understood below as being only a positive tensile force but optionally also a negative tensile force. In the case of an expansion instead of a shrinkage, moreover, the movement in the direction perpendicular to the carrier plate is to be understood as meaning a movement in the perpendicular direction away from the carrier plate. The joint or joint seam is understood as meaning not only a soldering gap filled with solder or solder joint but also a weld seam, an adhesive joint filled with adhesive or an adhesive gap, or any other joint or joint seam.

In the achievement, the invention starts from the basic concept of substantially compensating, by means of the controlled or regulated movement of the gripper, the tension or tensile force occurring owing to shrinkage, between the component and the carrier plate, optionally until a defined position is reached, in order to avoid undesired depositioning of the component during the shrinkage and/or during release by the gripper.

The movement of the gripper can be controlled and/or regulated. The control can be effected by an automatic sequence which follows an algorithm which is chosen in particular on the basis of the material properties and the shrinkage behaviour resulting therefrom and may be influenced by measurement of the ambient temperature or of the temperature of the joint seam cooling with shrinkage. The movement of the gripper is regulated, for example, by determining the stress occurring as a result of the shrinkage, in particular by measuring the force which is exerted on the gripper as a result of the solidifying joint seam, or measuring the vertical elastic displacement of the position of the gripper during the shrinkage.

An advantage of said measures is that, by compensating the stress or tensile force during the shrinkage, the final accuracy of mounting of the components is substantially increased and no high internal residual stresses which reduce the quality of the joint seam remain.

The invention also relates to gripping devices and manipulators of robot assembly stations which are equipped with force and/or position sensors. By means of these sensors, not only can the internal stresses and forces on the joint seam and/or the position of the gripper be determined during the shrinkage but also the movement of the gripper during the shrinkage can be regulated.

The method according to the invention and the gripping device according to the invention are suitable in particular for mounting miniaturized components, also referred to as micro components, which contain optical elements, such as, for example, lenses, optical fibres, diodes, etc.

The method according to the invention can be carried out by a control/regulation unit which controls and/or regulates the gripping and holding of the component by the gripper, the movement of the gripper through the robot station and the production of the joint by a device for producing the joint, for example a laser soldering unit.

The method according to the invention and the gripping device according to the invention are presented in detail below and are described in more detail on the basis of general examples, further advantages of the invention also being discussed.

The method according to the invention is used in particular in automatic robot assembly stations, since all functions required can be performed by robots which are provided with positioning sensors. Each component is positioned in space by a robot in the six degrees of freedom and is held. An example of a method for fixing a miniaturized component, in particular one of modular design, to a carrier plate by, for example, a solder joint is described in the above-mentioned WO 99/26754. Further methods of joining are, inter alia, welding, such as, for example, laser spot welding or electrical resistance spot welding, or adhesive bonding.

In the case of unhindered shrinkage, the final accuracy depends directly on the repeatability of the shrinkage. During the cooling phase in soldering and welding or the curing in adhesive bonding, the shrinkage at the weld joint between the component and the carrier plate unavoidably changes the component setting along the vertical axis. In the case of an obliquely positioned component or irregular joint surfaces, the shrinkage also affects the horizontal orientation of the component parallel to the surface of the component. However, this horizontal displacement can be prevented on the one hand by a corresponding design of the joint surface, known from the prior art, as well as by controlled limitation of the degrees of freedom during the solidification. Since the horizontal displacement is small compared with the vertical offset—in the direction towards the carrier plate—the residual stresses in the joint which form through prevention of the horizontal offset are small and not critical. With the knowledge of the process parameters, the shrinkage shows very good repeatability and can be calibrated as a function of the intermediate space between the carrier plate and the component. Good accuracy of fixing can be achieved only if the shrinkage has been incorporated in advance in the positioning by calculation, before the soldering, adhesive bonding or welding method begins. This is effected, for example, by previously taking into account the magnitude of the shrinkage in the vertical orientation of the component above the carrier plate. If the base of the component is provided with a spherical or cylindrical symmetry, the lateral accuracy and the angular accuracy are not changed by the shrinkage.

During the fixing, the component is held by a gripper of the robot station, the gripper being actively moved through the robot station in the vertical direction, i.e. perpendicular to the carrier plate. For this purpose, the gripper is fixed to a holder or an arm of the robot station, which are lowerable at least in the vertical direction towards the carrier plate and optionally are movable in all six degrees of freedom. As soon as the shrinkage begins, the gripper is actively moved with control and/or regulation vertically relative to the carrier plate to the extent of the shrinkage, in order to prevent the excessively large buildup of a vertical tensile force, which is generated by the vertical shrinkage, between the component and the gripper and hence the excessively large buildup of internal stresses in the joint seam, optionally until the required position is reached. It may be possible to establish a negative tensile force, i.e. a compressive force, instead of the positive tensile force. In this case, the gripper exerts a certain pressure on the joint seam, which would be reduced by the shrinkage but which is maintained by the adjustment of the gripper. It is preferable if the shrinkage is continuously followed by vertical adjustment. What is important is that the compensation of the shrinkage be controlled and/or regulated by the vertical movement of the gripper in the direction towards the carrier plate so precisely that the occurrence of stresses, tensile and/or drag forces in the system comprising component, joint seam, carrier plate, gripper and holder is substantially avoided and the required position is reached.

In a possible embodiment, the adjustment in the vertical direction is limited by blocking the gripper in the direction towards the carrier plate after reaching a predetermined vertical required position—perpendicular to the carrier plate. Although this gives rise to greater internal stresses in the joint seam and in the total system, it is possible to increase the accuracy of final positioning. However, it should be noted that the required position and the position which would be assumed in the case of unhindered shrinkage are permitted to differ only slightly, since otherwise excessively high stresses, in particular residual stresses, occur and adversely affect the quality of fixing and accuracy of final positioning. The best results are obtained with an exact knowledge of the degree of shrinkage and exact following of the shrinkage.

Owing to the repeatability of the shrinkage, the shrinkage behaviour of the materials used can be determined beforehand experimentally or by simulation, an algorithm can be established using the data determined, and hence an automatic sequence can be implemented in the robot station, by means of which the movement of the gripper is then controlled during shrinkage. Since the rate of solidification is dependent in particular on the ambient temperature, the algorithm should be capable of being adapted to the respective ambient temperature, if it is not possible to ensure a constant ambient temperature during the entire manufacturing process.

In a further embodiment of the present invention, a force sensor is integrated into the gripper. As soon as a joint seam has been produced between the component and the carrier plate, and the base of the component held by the gripper is wet with the still liquid soldering, adhesive or welding medium, the stress of the liquid or soft joint seam is measured—in particular by means of a force sensor which measures the actual vertical tensile force on the gripper—before the shrinkage begins. The measured value determined then serves as a setpoint value in a control loop which regulates the movement of the gripper by means of a deviation which is obtained from the difference between setpoint value and the value measured during the shrinkage. If the shrinkage now induces a tensile force in the direction of the carrier plate toward the component, the gripper is moved vertically in the direction of the carrier plate until the tensile force is for the most part compensated, i.e. the setpoint value is reached.

The mode of operation of such a control loop is known. The reference variable is specified directly or indirectly in the method described above by a required mechanical stress at the joint seam. The control variable of the control loop is generated directly or indirectly by the actual mechanical stress at the joint seam. The required stress and the actual stress need not be determined explicitly since the specification of a required tensile force in the measurement of an actual tensile force, which in each case may also be negative, at the gripper are easier to determine. The actual stress is matched with the required stress by the active movement of the gripper in a direction towards the carrier plate.

In another embodiment of the invention, the gripper is designed to be freely movable to a slight extent relative to the robot station and vertically relative to the carrier plate. This free mobility can be achieved, for example, by a spring which permits a slight vertical movement of the gripper and by means of which the gripper is connected to the robot station. In this case, the gripper is equipped with a position detector which measures the movement relative to the robot station. The relative vertical position of the gripper in turn is measured as soon as a joint seam has been produced between the base of the component held by the gripper and the carrier plate, but before the shrinkage begins. The measured value determined, i.e. the relative vertical position, is then included as the setpoint value in a control loop which regulates the vertical movement of the gripper by means of a feedback signal from the comparison of the setpoint value with the actual position measured during the shrinkage. If, owing to the tensile force generated by the shrinkage, the vertical position of the gripper is now displaced somewhat in the direction of the carrier plate, the forced displacement is compensated again immediately thereafter by corresponding active, vertical adjustment of the position of the gripper by the robot station. Said slight free mobility serves substantially for measuring purposes.

Of course, movements controlled by automatic sequences can additionally be precisely adjusted by means of the control loops which use force and position detectors.

Since the actual degree of shrinkage during cooling depends on the actual temperature of the joint seam, it is moreover possible to determine the actual temperature of the joint seam, for example by means of noncontact surface temperature measurement, instead of or in addition to the determination of the stress by force or distance measurement, and to determine the stress therefrom and to control the vertical adjustment of the gripper.

Since the fixing of the component to the carrier plate is carried out by a robot assembly station, the accuracy of fixing is also influenced by the gripping strength of the gripper which is mounted on the robot arm. The gripper must grip the component, position it relative to external reference points, hold it in its position during the soldering, welding or adhesive bonding and release it after the fixing has been completed. Owing to the small dimensions of the component, for example 2×2×3 mm, it is difficult to grip it constantly.

The required gripping force can be provided in different ways, but, owing to the small dimensions of the component, it is difficult to exert a force with sufficient care. The gripping force must on the one hand be sufficiently large to avoid any movement of the component relative to the gripper in the held state and on the other hand must be sufficiently small to avoid damaging the component. Because of the increased accuracy of fixing which is required, the component must be released by the gripper without its positioning being impaired as a result of the release. A large number of solutions in which the gripping force is generated by a mechanical effect are unsuitable since the accuracy of fixing might be impaired during the release phase. A gripper whose holding force is generated by a magnet, in particular an electromagnet, has proved to be a suitable solution. The principle of application of the holding force by means of an electromagnetic is known from the prior art and is described, for example, in WO 00/28367.

The method according to the invention is described in more detail below with reference to two general examples.

In a first example, miniaturized components are fixed to a carrier plate, coated with a metal coating, by soldering and by controlling the movement of the gripper by means of an automatic sequence.

The following fundamental soldering method is described, for example, in part in WO 99/26754. The component is coated with solder material on the base to be joined, gripped by the gripper of the robot station and oriented in its position above the carrier plate so that a small gap for the solder joint and additionally play for compensation of the shrinkage remains between the base of the component and the carrier plate. For this purpose, the extent of the shrinkage is determined in preliminary experiments. If, for example, these experiments give an amplitude of shrinkage of −4.5 μm±0.5, the robot station positions the component at its final vertical position of +4.5 μm, i.e. the expected shrinkage is taken into account in the vertical height before joining. The solder material on the base of the component is then melted by means of a laser so that a drop of solder material which fills the gap and produces the joint between the two parts forms between the base of the component and the carrier plate.

In an improvement of this method, the automatic sequence based on an algorithm is now started immediately after the laser has been switched off, with the result that the yielding vertical movement of the gripper in the direction of the carrier plate during the shrinkage is actively controlled:

During the cooling, the temperature T forms an asymptote which starts at the joint temperature $T_f$ and approaches ambient temperature. The vertical shrinkage x is proportional to the cooling, so that the following is applicable to the automatic sequence: $\Delta x \approx \alpha (T_f - T)$, where $\alpha$ is the approximate coefficient of thermal expansion of the system.

Depending on the material used, the cooling phase lasts for about 2 to 10 seconds. Thereafter, the component is released again by the gripper.

The temperature curve thus gives a function for the vertical positioning of the gripper. This function can of course be automatically adapted to the ambient conditions, in particular the ambient temperature. Since the vertical adjustment is made under control and the gripper always releases the component at the same vertical position, accuracy of positioning is always substantially constant.

In a second example below, fixing of a component to a carrier plate by soldering is described, the compensating movement of the gripper taking place with regulation by control loops which use force and/or position detectors.

In contrast to the method described in WO 99/26754, in this example the solder material is applied directly to the carrier plate. After the component has been brought into position without contact above the carrier plate by the robot station, a laser is switched on for n seconds in order to melt the solder material, when $n < t_{max}$ and $t_{max} =$ duration of the laser pulse. Either the solder material can be directly exposed obliquely to a laser arranged above the carrier plate or the laser is mounted below a carrier plate which is transparent to laser beams and coated with a metal layer, whereupon, in the latter case, the laser beam passes through the carrier plate, strikes the metal layer, heats up the metal layer and thus causes the solder material to melt. Thereafter, the gripper, which is equipped with a force or position detector, is lowered with the component towards the carrier plate so that the molten solder material wets the base of the component, whereupon the gripper together with the component is raised to a vertical position relative to the carrier plate, which position corresponds to the final mounting position determined plus the expected shrinkage. The gripper must have reached the final position before $t_{max}$. Thereafter, the laser is switched off and the measured value of the detector at the time of switching off is stored, it being possible to derive the internal stress or the tensile force from said measured value. The servo control sequence is then started, while the solder material cools. For this purpose, the stored detector measured value is used as a setpoint value for the feedback loop for controlling the vertical movement of the gripper. After solidification of the solder material, the component is released by the gripper.

Since, in the second example, the vertical position variation of the gripper during solidification is not time-controlled but stress- and/or force-regulated, the buildup of stresses and tensile forces is substantially avoided. Optionally, measured values can be recorded during the solidification process and logged for purposes of quality assurance. Moreover, it is possible to use recorded measured values as a basis for fuzzy logic. Thus, for example, it is feasible to measure the final position reached without stress, to compare the actual position value obtained with the required position value, to calculate the difference and to correct the prepositioning of the next component accordingly so that correspondingly improved accuracies of positioning are achieved in each subsequent fixing process.

The gripping device and in part the method according to the invention are shown in detail below on the basis of different schematic and specific embodiments, in the form of drawings. Specifically, FIG. 1 shows a schematic diagram of a gripper having a force sensor;

Figure 1:
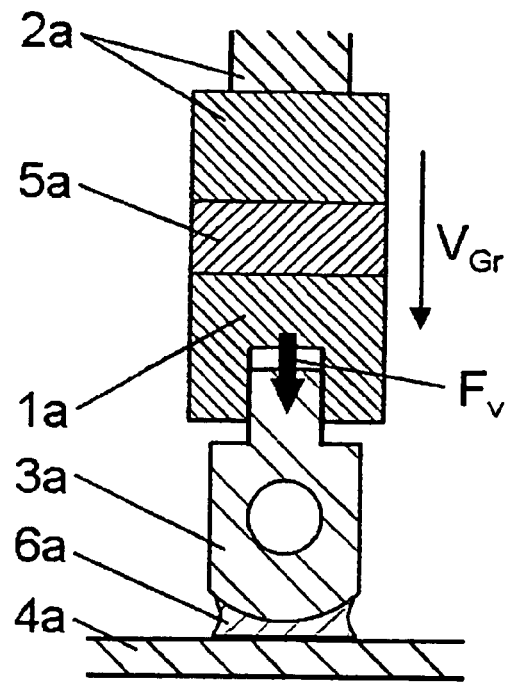

FIG. 1 schematically shows a gripper 1a which is connected to a robot station 2a, of which only a small cut-out in the form of an arm section is shown. The arm of the robot station 2a has a certain number of degrees of freedom but is adjustable at least in the vertical direction $V_{Gr}$. The gripper 1a has, for example, the design of a gripper which is known from the prior art and in which the gripping force is applied by means of an electromagnet and, in FIG. 1, detachably holds a micro component 3a having a spherical base, which—in the state shown in FIG. 1—is joined by means of solidifying solder material in the form of a joint seam 6a to a carrier plate 4a in a highly precise defined position. Since the joint seam 6a is in a state of cooling, it is subject to a shrinkage. Thus, a vertical tensile force $F_v$ is exerted on the substantially nonyielding gripper 1a. The gripper 1a has a vertical force sensor 5a for precise measurement of this vertical tensile force $F_v$ between the gripper 1a and the arm of the robot station 2a before, during and after the solidification process of the molten solder material joining the micro component 3a to the carrier plate 4a in the form of the joint seam 6a. The force sensor 5a is formed by a known force sensor—for example a piezo sensor. Depending on the measured tensile force $F_v$ and optionally the time and/or the temperature of the solder material, the gripper 1a is moved by the robot arm in the vertical direction $V_{Gr}$ perpendicular to the carrier plate 4a, optionally until a required vertical position is reached.

Figure 2:
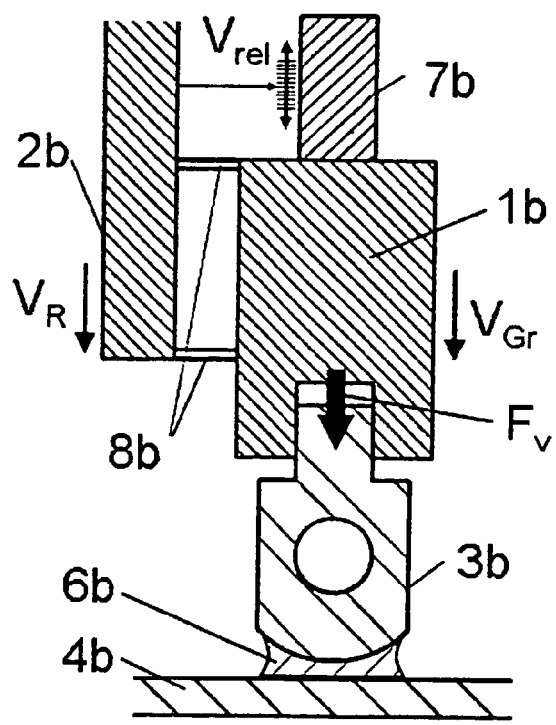
FIG. 2 shows a schematic diagram of a gripper having a position detector.

FIG. 2 shows a gripper 1b which holds a micro component 3b having a likewise spherical base, which—in the state shown in FIG. 2—is joined by means of solidifying solder material in the form of a joint seam 6b to a carrier plate 4b in a highly precise defined position. The gripper 1b is arranged by means of springs 8b on a robot assembly station 2b, of which only an arm section adjustable at least in the vertical direction $V_R$ is shown. The springs 8b permit slight relative displaceability $V_{rel}$ of the gripper 1b relative to the arm section of the robot assembly station 2b in the vertical direction. This vertical displaceability $V_{rel}$ is, in line with Hooke's law, dependent on the force $F_v$ applied vertically to the gripper 1b and on the spring constants of the springs 8b. For measurement of this vertical displacement $V_{rel}$, from which the vertical force $F_v$ can be derived, a vertical position detector 7b which measures the vertical position $V_{rel}$ of the gripper 1b relative to the position $V_R$ of the arm section of the robot assembly station 2b is mounted on the gripper 1b. This vertical relative displaceability $V_{rel}$ thus serves in particular for the purposes of force measurement by means of distance measurement and is so small that the resilience of the gripper is small in relation to the vertical shrinkage of the joint seam 6b under the resultant forces. The compensation of stresses by avoidance of an excessively high vertical force $F_v$ is effected by adjustment of the arm of the robot station 2b in the vertical direction $V_R$. As a result of the cooling of the solder material 6b, the latter shrinks and thus gives rise to the vertical force $F_v$ on the gripper in the direction towards the carrier plate 4b. The micro component 3b together with the gripper 1b is drawn along in the shrinkage direction, i.e. vertically relative to the carrier plate 4b, initially to a slight extent, by means of the spring 8b. There is therefore a vertical displacement $V_{rel}$ in the position of the gripper 1b relative to the arm of the robot station 2b. This vertical relative displacement $V_{rel}$ in position is detected by the position detector 7b, whereupon a feedback signal is sent to the robot assembly station 2b in order to readjust the vertical position setting $V_R$ of the arm of the robot station 2b and the position $V_{Gr}$ of the gripper 1b vertically so that the vertical displacement $V_{rel}$ of the gripper relative to the arm of the robot assembly station 2b, caused by the shrinkage, is compensated again and the vertical tensile force $F_v$ is thus reduced. The vertical position $V_{Gr}$ of the gripper 1b can be derived from the sum of the vertical position $V_R$ of the arm of the robot station 2b and the vertical relative displacement $V_{rel}$ in position.

Figure 3:
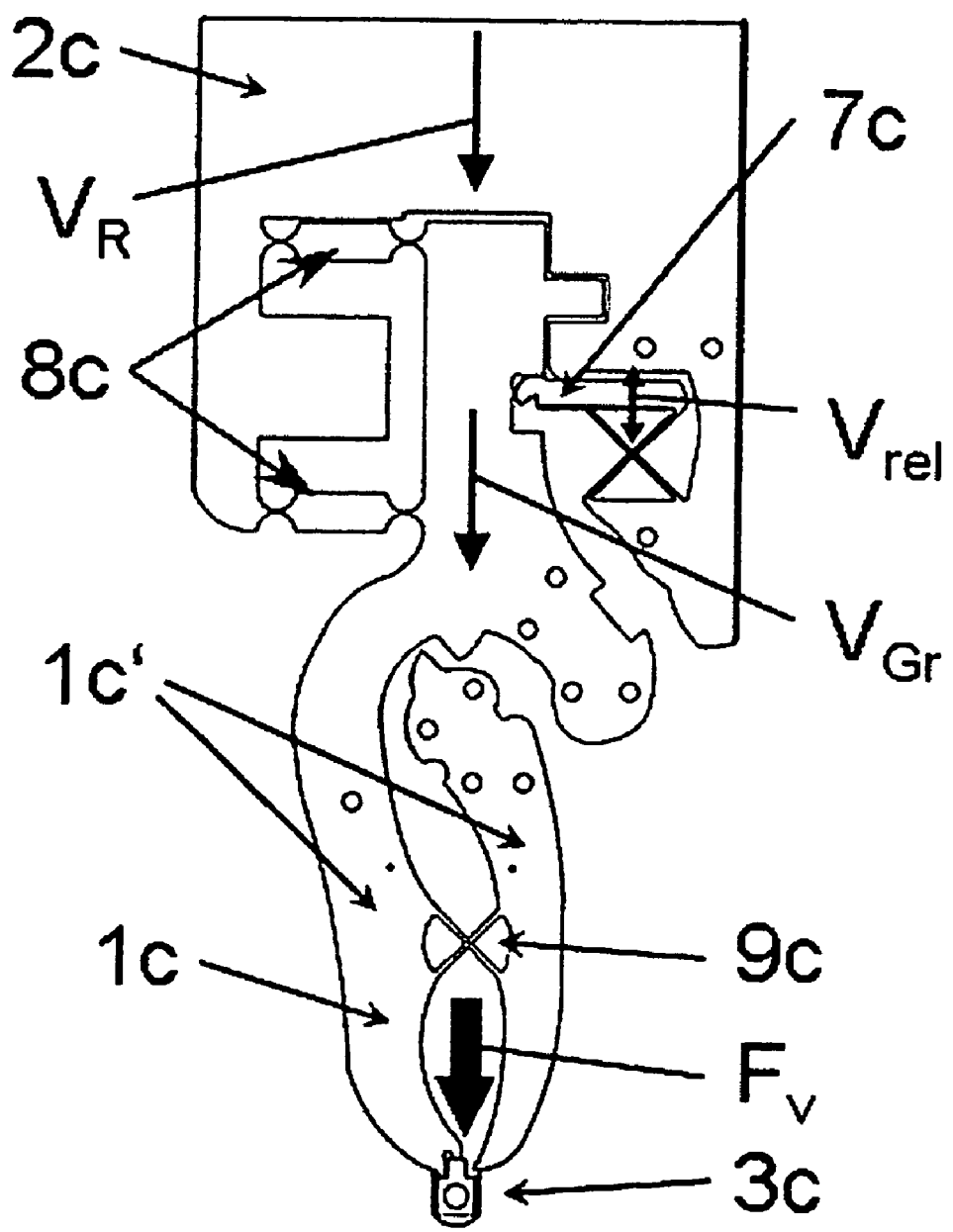
FIG. 3 shows a specific embodiment of the gripper shown schematically in FIG. 2.

FIG. 3 shows a specific embodiment of the gripper 1b shown schematically in FIG. 2. The gripper 1c shown has two gripping fingers 1c' which are connected to one another by a joint 9, via which the gripping force introduced by means of an electromagnet is deflected. In the state shown, the gripping fingers 1c' grip a micro component 3c. The gripper 1c is connected by means of springs 8c to an arm of the robot station 2c, which arm is adjustable at least vertically by $V_R$. The gripper is thus movable slightly in the vertical direction by the vertical relative displacement $V_{rel}$ in position, which displacement can be detected by a position detector 7c. A tensile force $F_v$ which the micro component 3c exerts on the gripper 1c can be derived from the spring constants of the springs 8c and the vertical relative displacement $V_{rel}$ in position.

The invention claimed is:

1. A method for fixing a miniaturized component on a carrier plate by a solder joint, weld joint or adhesive bond, comprising the steps:

gripping and holding the component by a gripper of a robot station, positioning the component with the gripper by the robot station above or on the carrier plate relative to outer reference points, producing a joint between the component and the carrier plate by soldering, welding or adhesive bonding, a joint seam being formed during the step of producing between the component and the carrier plate solidifying with shrinkage and thus exerting a tensile force on the gripper in the direction perpendicular to the carrier plate, and releasing the gripper from the component after the joint seam has substantially solidified, wherein, in the step including the producing of the joint between the component and the carrier plate, the gripper yields to the tensile force by a regulated active movement in the direction perpendicular to the carrier plate, wherein the tensile force is compensated at least partly by said regulated active movement of the gripper in the direction towards the carrier plate,
wherein the movement of the gripper is regulated by a control loop,
wherein a vertical actual tensile force ($F_v$) applied to the gripper is determined, and
wherein the vertical actual tensile force ($F_v$) is determined by means of a force sensor on the gripper.

2. The method according to claim 1, wherein the compensation is effected substantially continuously, in particular during the entire solidification process of the joint seam.

3. The method according to claim 1, wherein:
the tensile force is compensated by the regulated active movement of the gripper in the direction towards the carrier plate until a defined vertical required position has been reached, and
after the vertical required position has been reached, the active movement of the gripper is stopped or is reduced.

4. The method according to claim 1, wherein:
the reference variable of the control loop is formed directly or indirectly by a required mechanical stress at the joint seam,
the control variable of the control loop is formed directly or indirectly by an actual mechanical stress, which is linked to the tensile force, at the joint seam, and
the matching of the actual mechanical stress with the required mechanical stress is effected by the active movement of the gripper in the direction towards the carrier plate.

5. The method according to claim 4, wherein:
before the solidification of the joint seam which takes place with shrinkage, the mechanical stress at the joint seam is determined directly or indirectly by determination of an actual tensile force, and
the mechanical stress determined forms the required mechanical stress.

6. The method according to claim 4, wherein:
the required mechanical stress is predetermined by a vertical required tensile force, and
the actual mechanical stress is formed by a measured vertical actual tensile force.

7. A system for fixing a miniaturized component to a carrier plate by a solder joint, weld joint or adhesive bond, the system comprising:
a gripper for gripping, holding and positioning the miniaturized component relative to outer reference points above or on the carrier plate which is suitable for a mounting method, in which the component is fixed to the earner plate by soldering, welding or adhesive bonding,
a joint seam formed on the soldering, welding or adhesive bonding between the component and the carrier plate solidifying with shrinkage,
a force sensor for measurement of a force ($F_v$) applied to the gripper in the direction perpendicular to the carrier plate is coordinated with the gripper,
a robot station for movement and positioning of the gripper in at least one direction perpendicular to the carrier plate,
a means for producing the joint between the component and the carrier plate, and
a regulation unit for regulating at least:
the gripping and holding of the component by means of the gripper,
the movement of the gripper with the robot station, and
the production of the joint by means of the device for producing the joint,
wherein the regulation unit is designed for performing the following steps:
gripping and holding the component by the gripper of the robot station,
positioning the component with the gripper by the robot station above or on the carrier plate relative to outer reference points,
producing the joint between the component and the carrier plate by soldering, welding or adhesive bonding, a joint seam being formed during the step of producing of the joint between the component and the carrier plate solidifying with shrinkage and thus exerting a tensile force on the gripper in the direction perpendicular to the carrier plate, and
releasing the gripper from the component after the joint seam has substantially solidified,
wherein, in the step including the producing of the joint between the component and the carrier plate, the gripper yields to the tensile force by a regulated active movement in the direction perpendicular to the carrier plate, wherein the tensile force is compensated at least partly by said regulated active movement of the gripper in the direction towards the carrier plate,
wherein the movement of the gripper is regulated by a control loop,
wherein the vertical actual tensile force ($F_v$) applied to the gripper is determined, and
wherein the vertical actual tensile force ($F_v$) is determined by means of the force sensor on the gripper.

8. A method for fixing a miniaturized component on a carrier plate by a solder joint, weld joint or adhesive bond, comprising the steps:
gripping and holding the component by means of a gripper of a robot station,
positioning the component with the gripper by the robot station above or on the carrier plate relative to outer reference points,
producing a joint between the component and the carrier plate by soldering, welding or adhesive bonding, a joint seam being formed during the step of producing of the joint between the component and the carrier plate solidifying with shrinkage and thus exerting a tensile force on the gripper in the direction perpendicular to the carrier plate, and
releasing the gripper from the component after the joint seam has substantially solidified,
wherein, in the step including the producing of the joint between the component and the carrier plate, the gripper yields to the tensile force by a regulated active movement in the direction perpendicular to the carrier plate, wherein the tensile force is compensated at least partly by said regulated active movement of the gripper in the direction towards the carrier plate,
wherein the movement of the gripper is regulated by a control loop,
wherein the vertical actual tensile force ($F_v$) applied to the gripper is determined, and
wherein the vertical actual tensile force ($F_v$) is determined by:
the gripper being elastically movable relative to the robot station and perpendicular to the carrier plate, and
the vertical position ($V_{rel}$) of the gripper relative to the robot station is measured.

9. The method according to claim 8, wherein the vertical position ($V_{rel}$) of the gripper relative to the robot station is measured by means of a position detector.

10. The method according to claim 8, wherein the compensation is effected substantially continuously, in particular during the entire solidification process of the joint seam.

11. The method according to claim 8, wherein:
the tensile force is compensated by the regulated active movement of the gripper in the direction towards the carrier plate until a defined vertical required position has been reached, and
after the vertical required position has been reached, the active movement of the gripper is stopped or is reduced.

12. The method according to claim 8, wherein:
the reference variable of the control loop is formed directly or indirectly by a required mechanical stress at the joint seam,
the control variable of the control loop is formed directly or indirectly by an actual mechanical stress, which is linked to the tensile force, at the joint seam, and
the matching of the actual mechanical stress with the required mechanical stress is effected by the active movement of the gripper in the direction towards the carrier plate.

13. The method according to claim 12, wherein:
before the solidification of the joint seam which takes place with shrinkage, the mechanical stress at the joint seam is determined directly or indirectly by determination of an actual tensile force, and
the mechanical stress determined forms the required mechanical stress.

14. The method according to claim 12, wherein:
the required mechanical stress is predetermined by a vertical required tensile force, and
the actual mechanical stress is formed by a measured vertical actual tensile force.

* * * * *